(12) United States Patent
Perduijn et al.

(10) Patent No.: US 6,392,778 B1
(45) Date of Patent: May 21, 2002

(54) OPTO-ELECTRONIC ELEMENT

(75) Inventors: Armand B. Perduijn; Gibbo J. Abrahamse; Edwin M. Wolterink, all of Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/514,171

(22) Filed: Nov. 13, 1998

(30) Foreign Application Priority Data

Mar. 17, 1999 (EP) .............................. 99200811

(51) Int. Cl.⁷ .................. G02F 1/03; A04B 10/00; G02B 6/12
(52) U.S. Cl. ................... 359/245; 345/248; 345/143; 385/14
(58) Field of Search ................ 359/245, 248, 359/143, 152; 385/14, 16, 24

(56) References Cited

U.S. PATENT DOCUMENTS

| 4,458,123 A | | 7/1984 | Hengesh et al. ............. 200/159 |
| 4,697,061 A | * | 9/1987 | Spater et al. ................ 219/121 |
| 5,782,555 A | | 7/1998 | Hochstein .................... 362/373 |
| 6,034,712 A | * | 3/2000 | Iwasaki ....................... 347/241 |

FOREIGN PATENT DOCUMENTS

| DE | 4420698 A1 | 12/1995 | ............ H05K/3/32 |
| EP | 0602298 A1 | 6/1994 | ......... H01L/23/373 |
| EP | 19757850 A | 7/1998 | ........... H01L/33/00 |
| JP | 04113675 A | 4/1992 | ........... H01L/27/15 |
| JP | 11309902 A | 11/1999 | .............. B41J/2/44 |

* cited by examiner

Primary Examiner—Jordan Schwartz
Assistant Examiner—Timothy Thompson

(57) ABSTRACT

An opto-electronic element (1) is mounted on a substrate (2) comprising an electric circuit (3, 3') with an electrically conducting layer (4, 4'). The opto-electronic element (1) has a body (5) for emitting light in a pre-selected wavelength range and is provided with current conductors (7, 7') which contact the conducting layer (4, 4'). According to the invention, an adhesive material (8) is used to mount the opto-electronic element (1) on the substrate (2) with clearance with respect to the substrate (2), the body (5) contacting the substrate (2) via the adhesive material (8). Preferably, the adhesive material (8) is a heat-conducting material which serves to cool the body (5) during operation. In order to make a reliable interconnection, the geometry of the current conductors (7, 7') is optimized in such a way that a small tensile force (order of magnitude 1 N) is present in a weld between the current conductors (7, 7') and the conducting layer (4, 4'). The tensile force ensures that the opto-electronic element (1) is pressed into the adhesive material (8). The small tensile force is obtained by calibrating the current conductor (7, 7') during a "press" step in the laser-welding process.

11 Claims, 3 Drawing Sheets

OPTO-ELECTRONIC ELEMENT

BACKGROUND OF THE INVENTION

The invention relates to an opto-electronic element on a substrate with an electric circuit comprising an electroconductive layer, the opto-electronic element including a body for emitting light, during operation, in a predetermined wavelength range, and being provided with current conductors which contact the electroconductive layer.

The invention also relates to a method of providing an opto-electronic element on a substrate with an electric circuit comprising an electroconductive layer, the opto-electronic element comprising a body for emitting, in operation, light in a predetermined wavelength range, and being provided with current conductors which, after providing the opto-electronic element on the substrate, electrically contact the electroconductive layer.

Opto-electronic elements comprise electroluminescent elements, for example light-emitting diodes (LEDs). Such opto-electronic elements are used as a source of white or colored light for general lighting applications, and as a source of colored or white light in signaling lamps, for example in traffic control systems, vehicles, aircraft or other transport means or transport systems. In recent years, apart from yellow and red light-emitting diodes on the basis of GaP, also efficient blue and green light-emitting diodes on the basis of GaN have been developed.

An opto-electronic element mentioned in the opening paragraph is known from German patent DE-A 44 20 698. In that patent, a description is given of an opto-electronic element comprising a body and current conductors, which opto-electronic element is connected, by means of an adapter with a socket provided with channels for allowing passage of current conductors of the opto-electronic element, via current-supply conductors of the adapter, to an electroconductive layer on a substrate. Such an adapter is used in surface-mounting techniques, for example in a so-called SMD technique (Surface Mounted Device). The use of an adapter with a socket provided with channels has the disadvantage that additional parts are necessary for positioning the opto-electronic element and for connecting it to the substrate. Another unfavorable aspect resides in that the known opto-electronic element requires additional connections. The reason for this being that the current conductors of the known opto-electronic element are connected to the current-supply conductors of the adapter which in turn are connected to the electroconductive layer on the substrate. In addition, the adapter takes up additional space, which is unfavorable if mounting of opto-electronic elements in small housings is desired. A further drawback of the known opto-electronic element is that it has a relatively poor thermal balance during operation. Another unfavorable aspect resides in that the known opto-electronic element requires additional connections. The reason for this being that the current conductors of the known opto-electronic element are connected to the current-supply conductors of the adapter which in turn are connected to the electroconductive layer on the substrate. In addition, the adapter takes up additional space, which is unfavorable if mounting of opto-electronic elements in small housings is desired. A further drawback of the known opto-electronic element is that it has a relatively poor thermal balance during operation.

SUMMARY OF THE INVENTION

It is an object of the invention to provide an opto-electronic element of the type described in the opening paragraph, which can be readily and accurately mounted on the substrate. A further object of the invention is to provide a method by means of which an optoelectronic element can be readily provided on a substrate.

To achieve this, an opto-electronic element of the type described in the opening paragraph is characterized, in accordance with the invention, in that the body of the opto-electronic element is bonded by means of an adhesive at a predetermined location onto the substrate with clearance with respect to said substrate, the body contacting the substrate via the adhesive.

The use of an adhesive has the advantage that the opto-electronic element is directly connected to the substrate and, unlike the known opto-electronic element, without employing an adapter with a socket. As a result, the use of an adapter with a socket has become redundant, which causes costs to be reduced and, in addition, has a space-saving effect. In addition, a connection formed by using an adhesive enables the opto-electronic element to be accurately positioned, during mounting, at a predetermined location on the substrate.

The method of providing an opto-electronic element on a substrate, as mentioned in the opening paragraph, is characterized in that the body of the opto-electronic element is provided by means of an adhesive at a predetermined location on the substrate with clearance with respect to said substrate, said body making contact with the substrate via the adhesive.

During mounting the opto-electronic elements on the substrate, in general, first the body is provided in the adhesive. This takes place, preferably, at a stage where the adhesive (still) allows the body to move with respect to the substrate, for example when the adhesive has not yet (fully) cured. During mounting, the opto-electronic element is provided such that the body of the opto-electronic element does not contact the substrate and that, preferably, the current conductors of the opto-electronic element are exposed with respect to the substrate. This enables great freedom in the positioning of the opto-electronic element to be obtained without the current conductors causing damage (for example scratches) in the electric circuit or the electroconductive circuit on the substrate during movement of the opto-electronic element. Such damage may give rise to defective (electrical) connections, which is undesirable. A further advantage of current conductors which are exposed with respect to the substrate during mounting the opto-electronic element, resides in that a relatively thin adhesive layer can be used and that, after positioning the opto-electronic element on the substrate, the (rebounding) current conductors do not lift the opto-electronic element from the adhesive.

The adhesive causes the body to be positioned with clearance with respect to the substrate. The adhesive also causes the opto-electronic element to remain positioned at the predetermined location on the substrate during connecting the current conductors to the substrate. After the opto-electronic element has been provided at the desired location and positioned there, the current conductors are connected to the electroconductive layer at predetermined locations. For this purpose, a force is exerted on the current conductor, during the connecting process, causing the part of the current conductor which is connected to the electroconductive layer to contact the relevant, corresponding part of the electroconductive layer. In an alternative embodiment, first a force is exerted on the current conductor, causing the distance between the current conductor and the corresponding part of the electroconductive layer to be set at a predetermined, relatively small value, whereafter the current conductor is connected to the electroconductive layer.

A preferred embodiment of the opto-electronic element in accordance with the invention is characterized in that the current conductors are connected to the electroconductive layer while being subjected to a tensile force.

The advantage of a tensile force resides in that it causes the body of the opto-electronic element to engage the adhesive under spring pressure. In this manner, a permanent intense contact between the body and the adhesive is guaranteed.

Preferably, the tensile force in the connection between the current conductors and the electroconductive layer lies in the range between 0.4 and 2.0 N.

In an alternative embodiment of the opto-electronic element in accordance with the invention, the current conductors are connected to the electroconductive layer so as to be substantially stress-free. The absence, at least to a substantial degree, of tensile force in the resulting connection between the current conductors and the substrate causes the reliability of the connection during the working life to be improved.

A further object of the invention is to provide an opto-electronic element having an improved thermal balance. To achieve this, a particularly preferred embodiment of the opto-electronic element in accordance with the invention is characterized in that the adhesive is heat-conductive. In this embodiment, the adhesive is not only used as a means for improving the positioning of the opto-electronic element but also as a so-called heat sink, which causes heat to be dissipated, in operation, from the opto-electronic element to the adhesive. The application of a heat-conductive adhesive is important, in particular, for opto-electronic elements wherein the light output is dependent upon the temperature. Besides, the use of a heat-conductive adhesive also improves the service life of the opto-electronic element. A particularly suitable type of adhesive comprises a mixture of a type of adhesive which is known per se and a heat-conductive filler. By using a relatively thin adhesive layer, also the heat dissipation of the opto-electronic element is improved. Preferably, the thickness of the adhesive layer is less than 50 $\mu$m.

A further preferred embodiment of the opto-electronic element in accordance with the invention is characterized in that the substrate is provided with means for dissipating heat from the body via the adhesive to the substrate during operation. In this manner, heat originating from the opto-electronic element is effectively dissipated via the adhesive to the substrate.

The current conductors of the opto-electronic element are connected to the electroconductive layer of the substrate, preferably, by means of laser welding. Laser welding has the advantage that heat is very locally supplied to the current conductor during a relatively very short period of time. In this manner, heat is prevented from undesirably flowing to the opto-electronic element, which could cause damage to said opto-electronic element. In addition, laser welding has the advantage that the connection between the current conductor and the substrate can be accurately made at predetermined locations on the substrate. The appearance of the resulting welded joint is characteristic of laser welding.

For the substrate use can very suitably be made of a so-called metal-based printed circuit board (PCB) comprising an aluminium base layer, a glass-fiber reinforced insulation layer and a top layer of copper, wherein the electronic circuit is provided, for example, by, means of an etch treatment. The high coefficient of thermal conduction of copper enhances the dissipation of heat originating from the opto-electronic element, which reaches the substrate via the adhesive. In an alternative embodiment, the substrate comprises a metal-core base plate provided with a PCB.

Preferably, the opto-electronic element comprises a light-emitting diode. A further preferred embodiment of the opto-electronic element in accordance with the invention is characterized in that the wavelength range wherein the opto-electronic element emits light includes wavelengths above 550 nm. Particularly opto-electronic elements, for example light-emitting diodes, which emit light in this (yellow, red or infrared) wavelength range are temperature-sensitive, i.e. the light output of the opto-electronic element is temperature-dependent. In general, yellow and red light-emitting diodes are made on the basis of AlInGaP, and blue and green light-emitting diodes are made on the basis of InGaN.

BRIEF DESCRIPTION OF THE DRAWING

These and other aspects of the invention will be apparent from and elucidated with reference to the embodiments described hereinafter.

In the drawing.

The figures are purely diagrammatic and not drawn to scale. Particularly for clarity, some dimensions are exaggerated strongly. In the figures, like reference numerals refer to like parts whenever possible.

DESCRIPTION OF THE PREFERRED EMBODIMENTS

Figure 1:
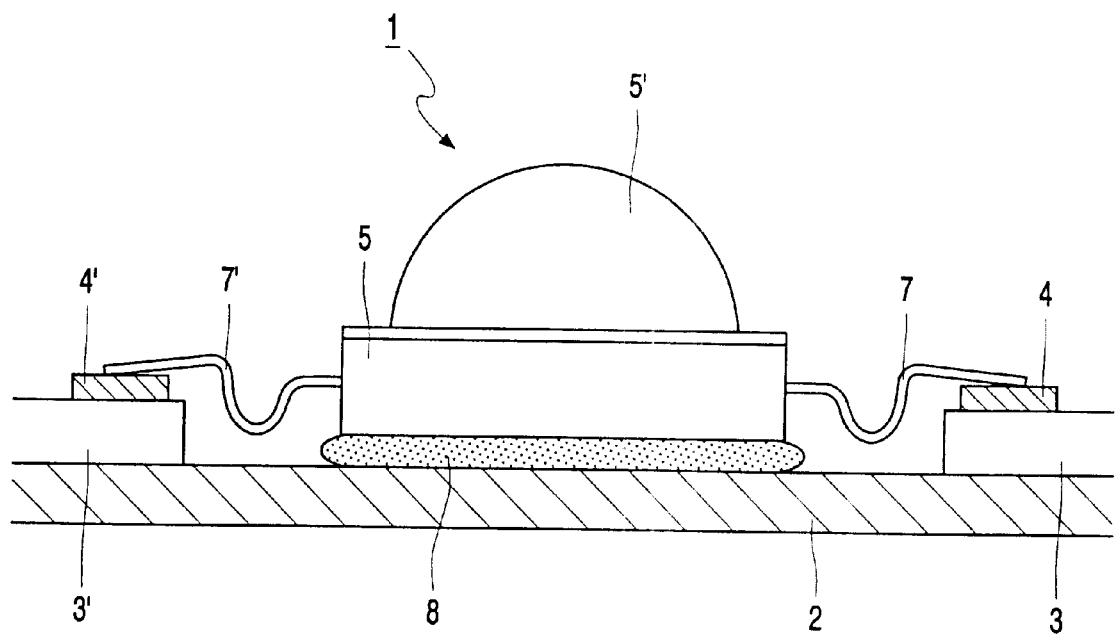
FIG. 1 is a cross-sectional view of an embodiment of an opto-electronic element in accordance with the invention.

FIG. 1 is a cross-sectional view of an embodiment of an opto-electronic element 1 in accordance with the invention, wherein the opto-electronic element 1 is provided on a substrate 2 having an electric circuit 3, 3' which comprises an electroconductive layer 4, 4'. The opto-electronic element is composed of a body 5 for emitting, in operation, light in a predetermined wavelength range. Suitable opto-electronic elements are so-called electroluminescent elements, for example light-emitting diodes (LEDs), such as diodes which emit light of a specific color or which in combination with, for example, a luminescent material, emit white light. In the embodiment shown in FIG. 1, the body 5 is provided with a light-transmitting envelope 5', for example in the form of a lens. The opto-electronic element 1 is provided with current conductors 7, 7' which make contact with the electroconductive layer 4, 4'. In accordance with the measure of the invention, the body 5 of the opto-electronic element 1 is bonded to the substrate 2 at a predetermined location by means of a heat-conducting adhesive 8, the body 5 making contact with the substrate 2 via the adhesive 8.

The body 5 is provided with clearance with respect to the substrate 2. A particularly suitable type of adhesive is a mixture of a type of adhesive which is known per se and a heat-conducting filler. This filler may comprise, for example, filler particles of a predetermined diameter, the diameter of the filter particles determining a lower limit of the distance between the body 5 and the substrate 2 (the filler particles function, in this example, as so-called spacers). By using a relatively thin adhesive layer, also the heat dissipation of the opto-electronic element 1 is improved. Preferably, the thickness of the adhesive layer is less than 50 μm. A particularly suitable thickness of the adhesive layer is 35 μm. In an alternative embodiment, the adhesive 8 comprises a thin tape which is provided with an adhesive on two sides. The tape advantageously has good heat-conducting properties.

Figure 2A:
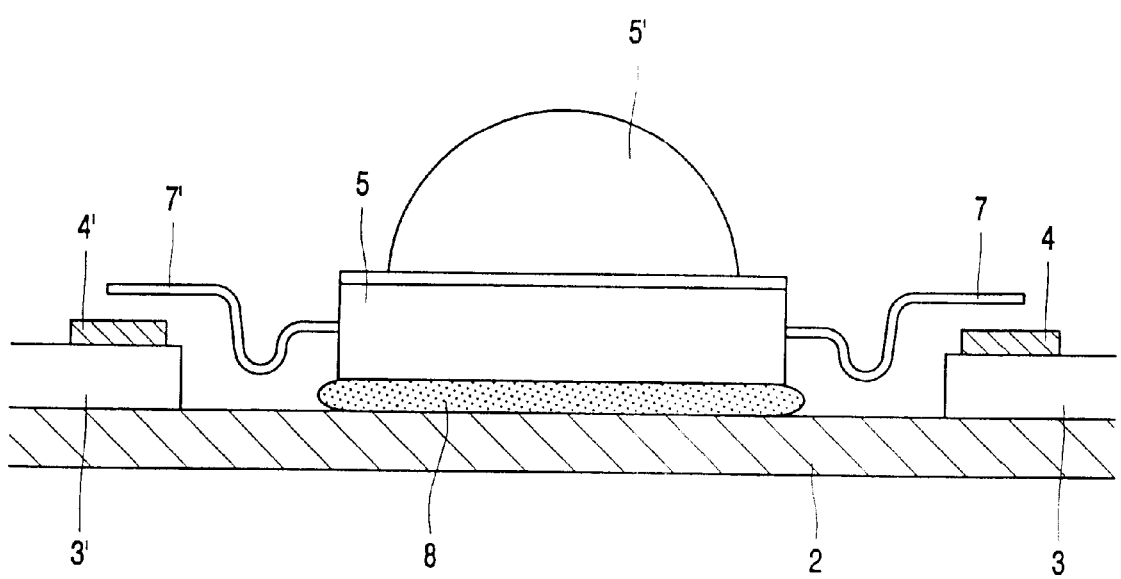
FIGS. 2A–D show a method in accordance with the invention, step by step, for positioning and connecting the opto-electronic element to the substrate.

In the FIGS. 2A–D the method in accordance with the invention is described step by step, the steps including positioning of the opto-electronic element on the substrate and connecting it thereto. In FIG. 2A, an opto-electronic element is placed on the substrate 2 at a predetermined location. In this embodiment, the substrate 2 comprises an aluminium base plate 2 which is provided with a standard so-called PCB (printed circuit board) 3, 3'. The current conductors 7, 7' of the opto-electronic element 1 are manufactured from stainless steel and exhibit a special geometry. The use of stainless steel has the advantage that it is a robust material and that it can resist the relatively high temperatures occurring during connecting the current conductors 7, 7' to the heat-conducting layer 4, 4'. The current conductors 7, 7' are exposed with respect to the substrate 2. This has the advantage that a relatively very thin adhesive layer can be used, and that, after positioning the opto-electronic element on the substrate, the (rebounding) current conductors do not press the opto-electronic element out of the adhesive.

The adhesive 8 causes the body 5 to be positioned with clearance with respect to the substrate 2. By virtue thereof, a great freedom in positioning the opto-electronic element 1 is obtained.

In mounting the opto-electronic element 1 on the substrate 2, as shown in FIG. 2A, the body 5 is provided in a heat-conducting adhesive 8. This takes place, preferably, at a stage where the adhesive 8 (still) allows the body 5 to move with respect to the substrate 2, for example when the adhesive 8 has not yet (fully) cured. The heat-conducting adhesive 8 causes the opto-electronic element 1 to be positioned at the predetermined location on the substrate 2 during connecting the current conductors 7, 7' to the substrate 2. The heat-conducting properties of the adhesive 8 enable heat to be dissipated from the body 5 of the opto-electronic element 1 to the adhesive 8 during operation. This is important, in particular, for opto-electronic elements 1 whose light output is temperature-dependent. In addition, the use of a heat-conducting adhesive 8 causes the working life of the opto-electronic element 1 to be improved.

In the situation shown in FIG. 2A, the current conductors 7, 7' are at a fairly large distance above the electroconductive layers 4, 4' at the location of the so-called "weld pad" (welding aid). This weld pad enables a good connection to the current conductor 7, 7', to be achieved at a later stage of the method. Said weld pad is, for example, soldered onto the electric circuit 3. The distance between the current conductor 7, 7' and the electroconductive layer 4, 4' of the electric circuit 3 is too large in FIG. 2A to enable a (direct) connection to be made between the current conductor 7, 7' and the electroconductive layer 4, 4'. For this reason, during a so-called calibration step, the current conductor 7, 7' is bent in a defined manner in order to obtain a controlled, relatively small slit between the current conductor 7, 7' and the electroconductive layer 4, 4'. During this calibration step (see FIG. 2B), a force 10 is exerted on the current conductor 7, 7'. In FIG. 2C, the situation after calibration is shown. The current conductor 7, 7' is bent, for example at a location where a weakening has been formed (see FIG. 4). The distance d between the current conductor 7, 7' and the electroconductive layer 4, 4' in the situation shown in FIG. 2C is preferably smaller than or equal to 100 μm, preferably d<50 μm. Subsequently, an electric connection between the current conductor 7, 7' and the electroconductive layer 4, 4' is brought about by means of a laser. In FIG. 2D, the laser beam is schematically represented as a beam 11. It is possible to use a plurality of welds per current conductor 7, 7'. A reduction of the slit between the current conductor 7, 7' and the electroconductive layer 4, 4' to the desired distance d enables the connection between the current conductor 7, 7' and the electroconductive layer 4, 4' to be achieved in a slit-bridging manner.

Figure 2B:
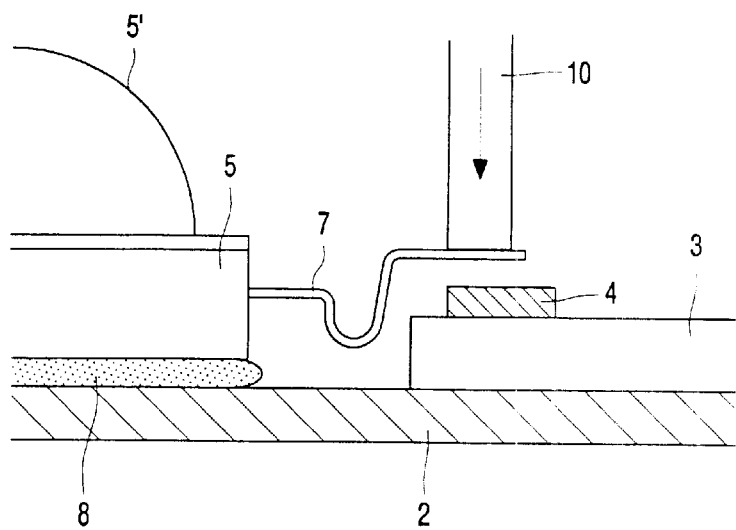
Figure 2C:
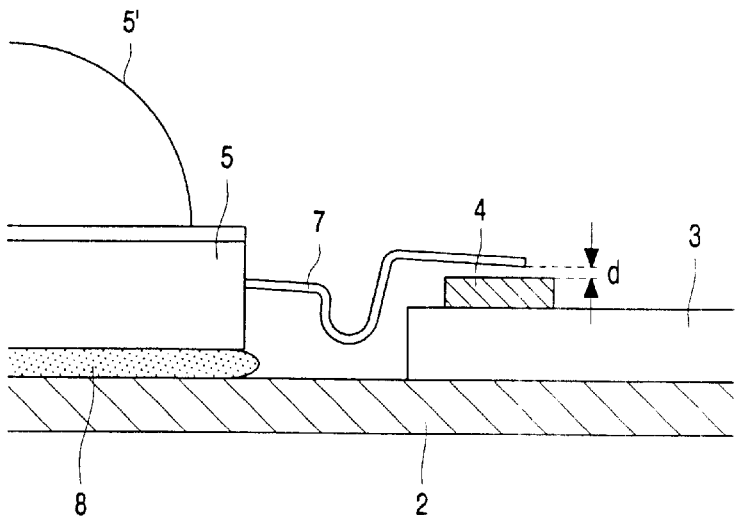
Figure 2D:
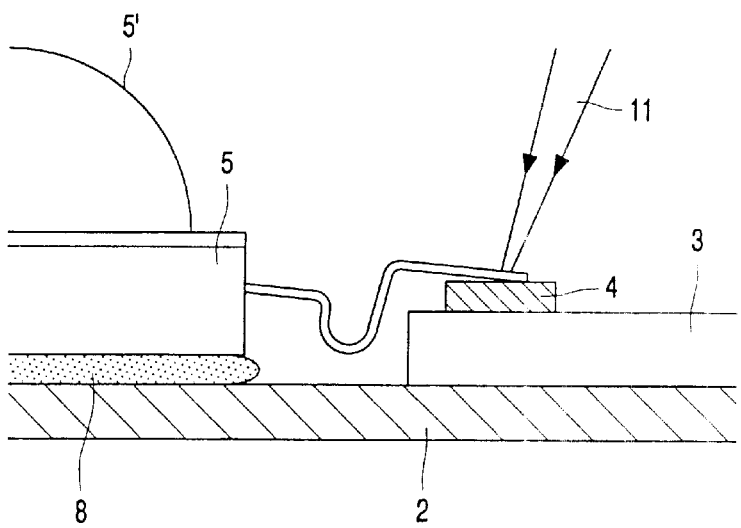

In the connection described in FIGS. 2B–2D, in principle, no tensile force is exerted. By combining the steps of the method shown in FIGS. 2B and 2D, the current conductor 7, 7' can be connected, while being exerted to a predetermined tensile force, to the electroconductive layer 4, 4'. This takes place, for example, by using the element exerting the force 10 on the current conductor 7, 7' also as a soldering iron. In this case, the weld pad comprises a solder. Under the influence of said tensile force, the body 5 of the opto-electronic element 1 engages the heat-conducting adhesive 8 under spring pressure, a permanent intense contact between the body 5 and the adhesive 8 being brought about. The tensile force preferably lies in the range between 0.4 and 2.0 N. A relatively small tensile force is needed because a larger value may lead to failure in the weld during the working life of the opto-electronic element. A particularly suitable value of the tensile force is 1 N. The geometry of the current conductors 7, 7' in combination with the calibration step can be optimized to obtain the desired value of the tensile force.

The opto-electronic element 1 is preferably provided on and (electrically) connected to the substrate 2 before the adhesive 8 has cured. If a check after welding reveals that the opto-electronic element 1 does not function properly, or that a wrong opto-electronic element 1 has been placed (for example of the wrong color), or that the opto-electronic element 1 has not been provided exactly at the predetermined location on the substrate 2, the opto-electronic element can be readily removed from the substrate 2. If the body 5 of the LED 1 is provided at the desired location on the substrate 2 and the connections between the current conductors 7, 7' and the conductive layer 4, 4' have been made with the desired reliability, then the adhesive 2 can be cured, for example in a suitable furnace.

Figure 3:
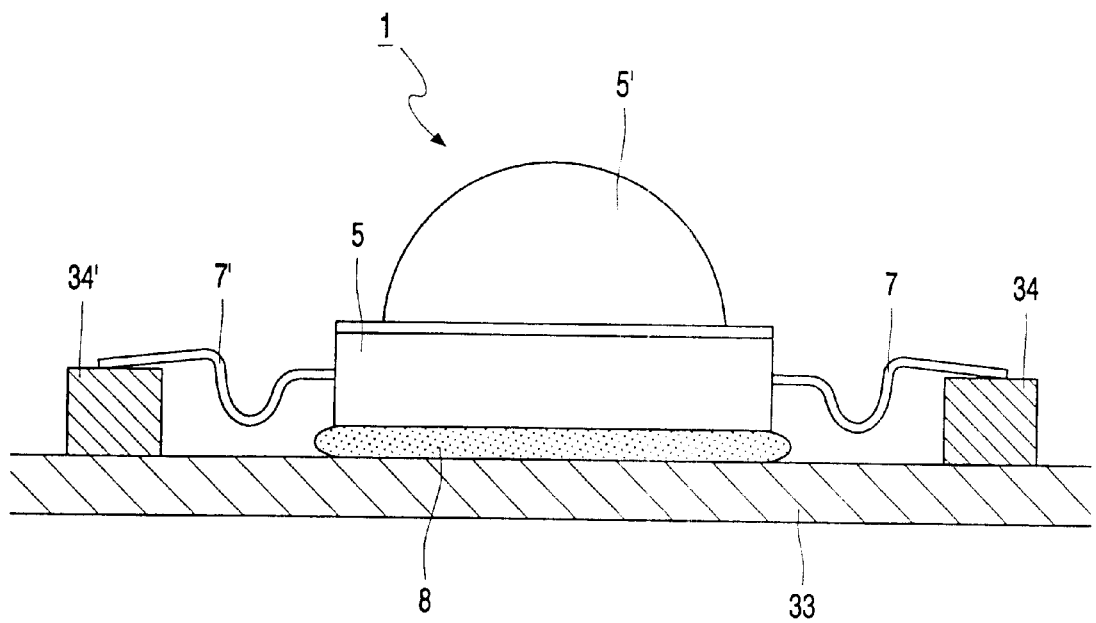
FIG. 3 is a cross-sectional view of an alternative embodiment of an opto-electronic element in accordance with the invention.

FIG. 3 is a cross-sectional view of an alternative embodiment of the opto-electronic element in accordance with the invention. In this embodiment, a so-called metal-core PCB 33 is used as the substrate, which is provided with an electroconductive layer 34, 34'. A suitable metal core is an aluminium base plate.

Figure 4:
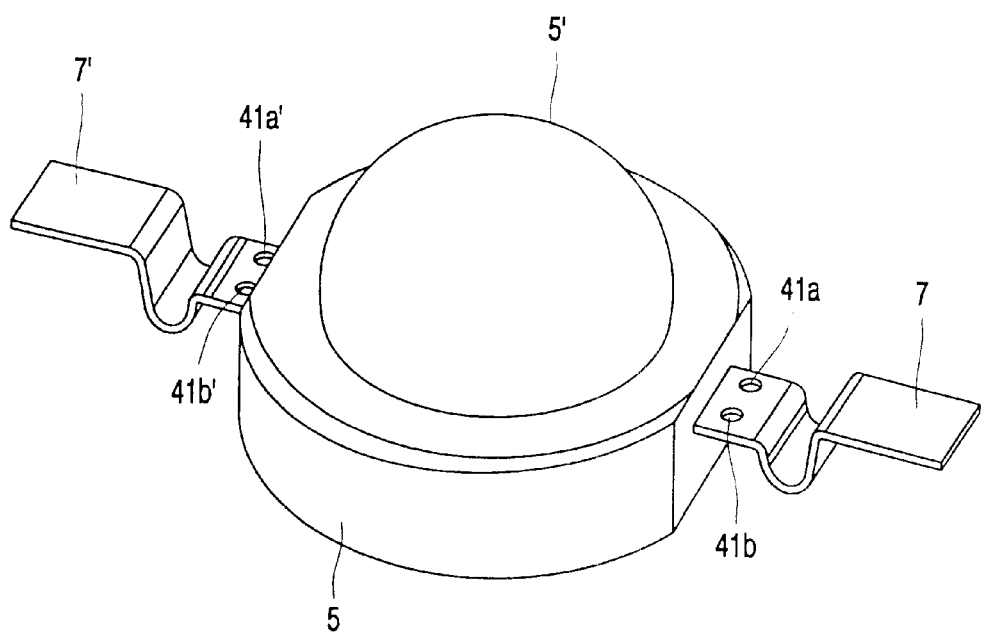
FIG. 4 is a perspective view of a further alternative embodiment of an opto-electronic element in accordance with the invention.

FIG. 4 shows a perspective view of a further alternative embodiment of the opto-electronic element in accordance with the invention. In order to determine the location where bending of the current conductor 7, 7' during the calibration step takes place, so-called weakenings 41a, 41b; 41a' 41b' have been provided at predetermined locations in the current conductors 7, 7'. An additional advantage of the provision of weakenings 41a, 41b, 41a', 41b', is that the size of the slit d after calibration (see FIG. 2C) can be given the desired value.

It will be obvious that within the scope of the invention many variations are possible to those skilled in the art.

The scope of protection of the invention is not limited to the above examples. The invention is embodied in each new characteristic and each combination of characteristics. Reference numerals in the claims do not limit the scope of protection thereof. The use of the word "comprising" does not exclude the presence of elements other than those mentioned in the claims. The use of the word "a" or "an" in front of an element does not exclude the presence of a plurality of such elements.

What is claimed is:

1. An opto-electronic element (1) on a substrate (2) with an electric circuit (3, 3') comprising an electroconductive layer (4, 4'), said opto-electronic element (1) including a body (5) for emitting light, during operation, in a predetermined wavelength range, and said opto-electronic element (1) being provided with current conductors (7, 7') which contact the electroconductive layer (4, 4'), characterized in that:

the body (5) of the opto-electronic element (1) is bonded by means of an adhesive (8) at a predetermined location onto the substrate (2) with clearance with respect to said substrate (2), the body (5) contacting the substrate (2) via the adhesive (8); and the current conductors (7, 7') are connected to the electroconductive layer (4, 4') while being subjected to a tensile force.

2. An opto-electronic element as claimed in claim 1, characterized in that the tensile force in the connection between the current conductors (7, 7') and the electroconductive layer (4, 4') lies in the range between 0.4 and 2.0 N.

3. An opto-electronic element as claimed in claim 1, characterized in that the current conductors (7, 7') are connected to the electroconductive layer (4, 4') so as to be substantially stress-free.

4. An opto-electronic element as claimed in claim 1, characterized in that the adhesive (8) is heat-conductive.

5. An opto-electronic element as claimed in claim 1 or 4, characterized in that the substrate (2) is provided with means for dissipating heat from the body (5) via the adhesive (8) to the substrate (2) during operation.

6. An opto-electronic element as claimed in claim 1, characterized in that the current conductors (7, 7') are connected to the electroconductive layer (4, 4') of the substrate (2) by means of laser welding.

7. An opto-electronic element as claimed in claim 1 or 4, characterized in that the opto-electronic element (1) comprises a light-emitting diode.

8. An opto-electronic element as claimed in claim 1 or 7, characterized in that the wavelength range includes light of wavelengths above 550 nm.

9. A method of providing an opto-electronic element (1) on a substrate (2) with an electric circuit (3) comprising an electroconductive layer (4, 4')

said opto-electronic element (1) comprising a body (5) for emitting, in operation, light in a predetermined wavelength range, said opto-electronic element (1) being provided with current conductors (7, 7') which, after providing the opto-electronic element (1) on the substrate (2), electrically contact the electroconductive layer (4, 4'), characterized in that:

the body (5) of the opto-electronic element (1) is bonded by means of an adhesive (8) at a predetermined location onto the substrate (2) with clearance with respect to said substrate (2), the body (5) contacting the substrate (2) via the adhesive (8); and the current conductors (7, 7') are connected to the electroconductive layer (4, 4') while being subject to a tensile force.

10. A method as claimed in claim 9, characterized in that the adhesive (8) used is heat-conductive.

11. A method as claimed in claim 10, characterized in that the current conductors (7, 7') are connected to the electroconductive layer (4, 4') so as to be substantially stress-free.

* * * * *